(12) United States Patent
Li et al.

(10) Patent No.: US 11,705,470 B2
(45) Date of Patent: Jul. 18, 2023

(54) IMAGE SENSOR SCHEME FOR OPTICAL AND ELECTRICAL IMPROVEMENT

(71) Applicant: Taiwan Semiconductor Manufacturing Co., Ltd., Hsin-Chu (TW)

(72) Inventors: Sheng-Chan Li, Tainan (TW);
Cheng-Hsien Chou, Tainan (TW);
Cheng-Yuan Tsai, Chu-Pei (TW);
Keng-Yu Chou, Kaohsiung (TW);
Yeur-Luen Tu, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 110 days.

(21) Appl. No.: 17/219,960

(22) Filed: Apr. 1, 2021

(65) Prior Publication Data

US 2021/0225919 A1 Jul. 22, 2021

Related U.S. Application Data

(63) Continuation of application No. 16/405,132, filed on May 7, 2019, now Pat. No. 10,998,364, which is a continuation of application No. 15/688,077, filed on Aug. 28, 2017, now Pat. No. 10,319,768.

(51) Int. Cl.
*H01L 27/146* (2006.01)

(52) U.S. Cl.
CPC .. *H01L 27/14629* (2013.01); *H01L 27/14607* (2013.01)

(58) Field of Classification Search
CPC ......... H01L 27/14629; H01L 27/14607; H01L 27/14601; H01L 27/1463
See application file for complete search history.

(56) References Cited

U.S. PATENT DOCUMENTS

| 7,061,106 | B2 | 6/2006 | Yang et al. |
| 7,446,359 | B2 | 11/2008 | Lee et al. |
| 10,079,259 | B2 * | 9/2018 | Yu ..................... H01L 27/14621 |
| 10,134,801 | B2 | 11/2018 | Lu et al. |
| 10,134,926 | B2 | 11/2018 | Akkaya et al. |

(Continued)

FOREIGN PATENT DOCUMENTS

CN 105428379 A 3/2016

OTHER PUBLICATIONS

U.S. Appl. No. 15/962,130, filed Apr. 25, 2018.
(Continued)

*Primary Examiner* — Seung C Sohn
(74) *Attorney, Agent, or Firm* — Eschweiler & Potashnik, LLC

(57) ABSTRACT

The present disclosure, in some embodiments, relates to an integrated chip. The integrated chip includes a photodetector arranged within a substrate. The substrate has surfaces defining one or more protrusions arranged along a first side of the substrate over the photodetector. One or more isolation structures are arranged within one or more trenches defined by sidewalls of the substrate arranged on opposing sides of the photodetector. The one or more trenches extend from the first side of the substrate to within the substrate. The one or more isolation structures respectively include a reflective medium configured to reflect electromagnetic radiation.

20 Claims, 10 Drawing Sheets

(56) References Cited

U.S. PATENT DOCUMENTS

| | | | |
|---|---|---|---|
| 10,157,946 B2 | 12/2018 | Tu et al. | |
| 10,163,974 B2 * | 12/2018 | Su | H01L 27/14689 |
| 10,211,244 B2 * | 2/2019 | Fang | H01L 27/14629 |
| 10,510,788 B2 * | 12/2019 | Chou | H01L 27/1463 |
| 10,672,817 B2 | 6/2020 | Lee et al. | |
| 2009/0283807 A1 | 11/2009 | Adkisson et al. | |
| 2016/0112614 A1 | 4/2016 | Masuda | |
| 2017/0040357 A1 | 2/2017 | Yu et al. | |
| 2017/0047367 A1 | 2/2017 | Lee et al. | |
| 2018/0151759 A1 | 5/2018 | Huang | |
| 2018/0359434 A1 | 12/2018 | Tanaka et al. | |

OTHER PUBLICATIONS

Notice of Allowance dated Apr. 17, 2019, for U.S. Appl. No. 15/688,077.
Non Final Office Action dated Jan. 27, 2020 in connection with U.S. Appl. No. 15/962,130.
Final Office Action dated Aug. 6, 2020 in connection with U.S. Appl. No. 15/962,130.
Non-Final Office Action dated Jan. 7, 2021 for U.S. Appl. No. 15/962,130.
Non-Final Office Action dated Sep. 29, 2020 for U.S. Appl. No. 16/405,132.
Notice of Allowance dated Jan. 7, 2021 for U.S. Appl. No. 16/405,132.

\* cited by examiner

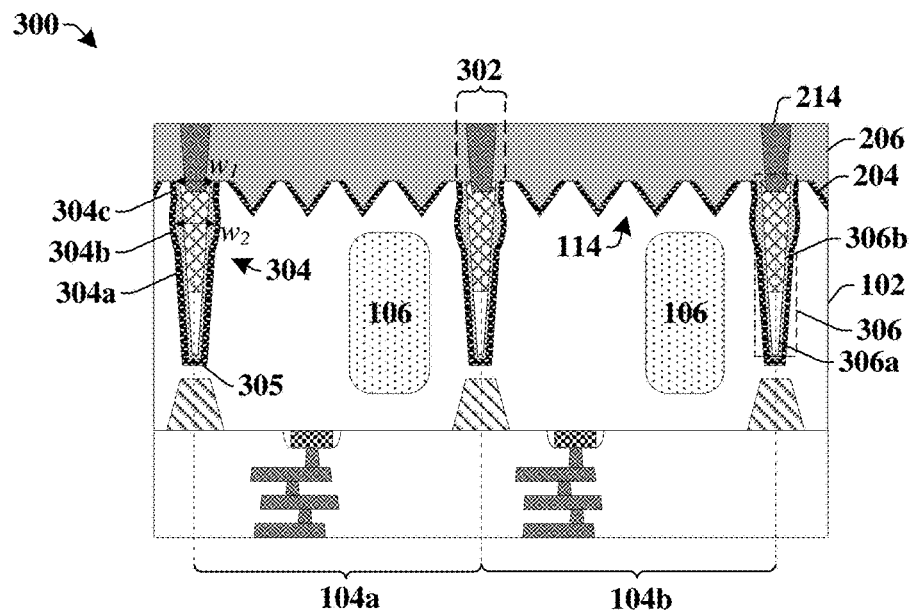
Fig. 3
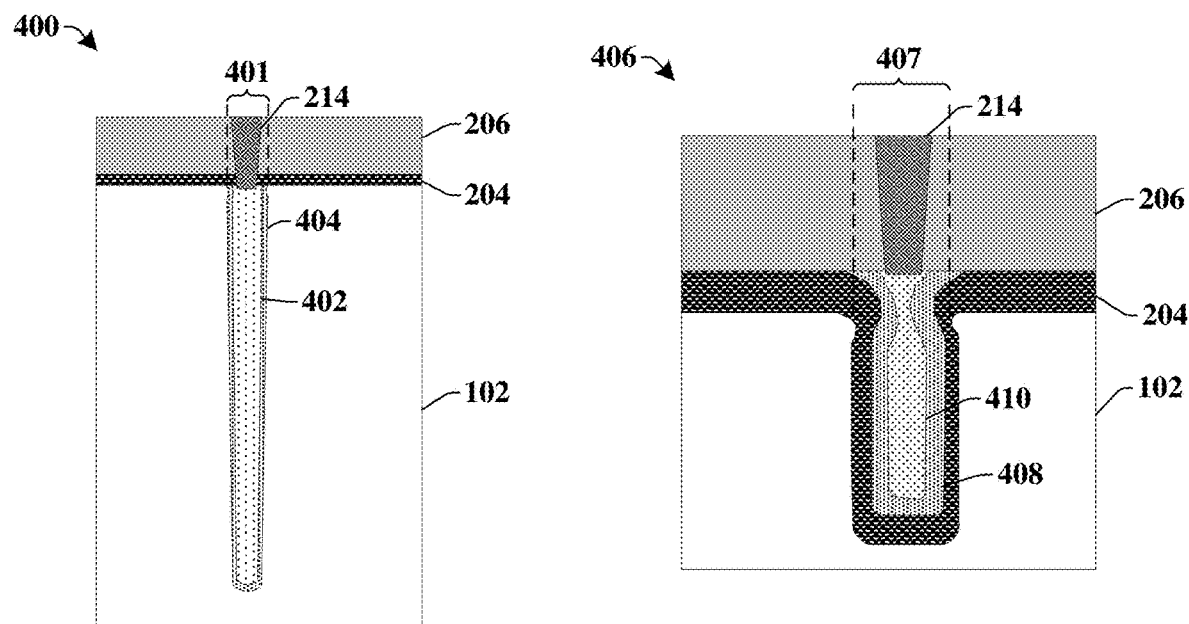
Fig. 4A
Fig. 4B

IMAGE SENSOR SCHEME FOR OPTICAL AND ELECTRICAL IMPROVEMENT

REFERENCE TO RELATED APPLICATIONS

This application is a Continuation of U.S. application Ser. No. 16/405,132, filed on May 7, 2019, which is a Continuation of U.S. application Ser. No. 15/688,077, filed on Aug. 28, 2017 (now U.S. Pat. No. 10,319,768, issued on Jun. 11, 2019). The contents of the above-referenced Patent Applications are hereby incorporated by reference in their entirety.

BACKGROUND

Integrated circuits (IC) with image sensors are used in a wide range of modern day electronic devices. In recent years, complementary metal-oxide semiconductor (CMOS) image sensors have begun to see widespread use, largely replacing charge-coupled devices (CCD) image sensors. Compared to CCD image sensors, CMOS image sensors are increasingly favored due to low power consumption, a small size, fast data processing, a direct output of data, and low manufacturing cost. Some types of CMOS image sensors include front-side illuminated (FSI) image sensors and back-side illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 illustrates a cross-sectional view of an additional embodiment of an image sensor integrated chip having a BDTI structure comprising a reflective element.

FIGS. 4A-4C illustrate some cross-sectional views of additional embodiments of BDTI structures comprising a reflective element.

DETAILED DESCRIPTION

Figure 1:
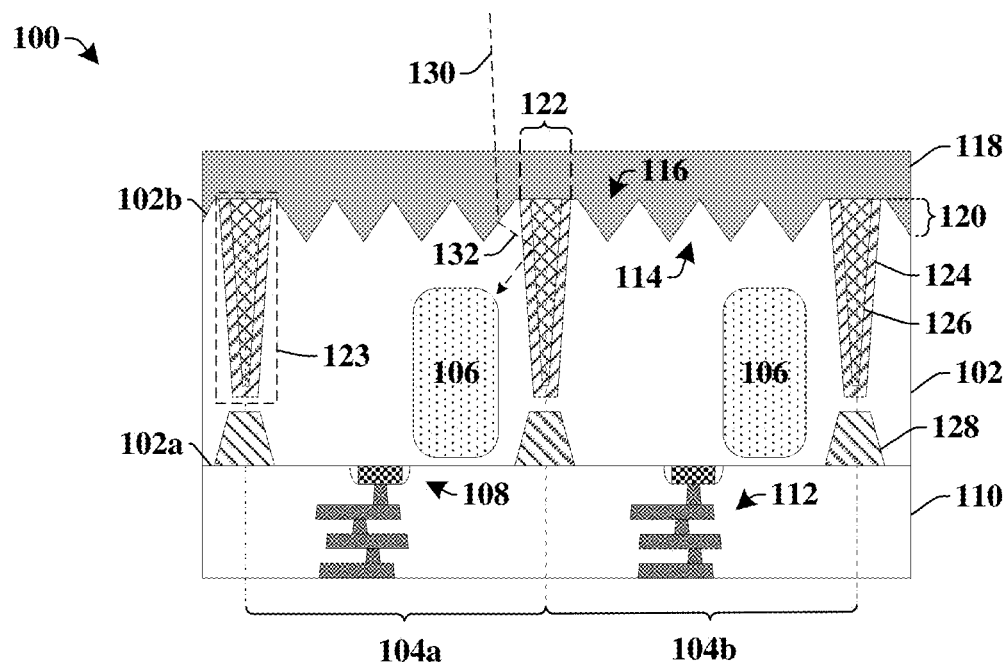
FIG. 1 illustrates a cross-sectional view of some embodiments of an image sensor integrated chip having a deep trench isolation (DTI) structure comprising a reflective element configured to reduce cross-talk between pixel regions.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

CMOS image sensors generally comprise a plurality of pixel regions respectively having an image sensing element. Over time, the semiconductor industry has reduced a size of pixel regions, so as to increase a number of pixel regions in a CMOS image sensor (CIS) integrated chip. Increasing the number of pixel regions in a CIS integrated chip increases the resolution of an image captured by the CIS integrated chip. However, as the size of the pixel regions gets smaller, the pixel regions come closer together and crosstalk between adjacent pixel regions increases.

Crosstalk occurs when incident light directed towards one pixel region is undesirably sensed by another pixel region, thereby degrading a quality of an image captured by a CIS integrated chip. It has been appreciated that intervening layers arranged between a color filter and an image sensing element may increase crosstalk between adjacent pixel regions. This is because when adjacent intervening layers have different indices of refraction, the layers may refract (i.e., change in a direction of propagation of a light wave) an incident light ray according to Fresnel's equation. Furthermore, if an interface between adjacent intervening layers is not planar, refracted light may be even more likely to travel in a lateral direction and increase cross-talk.

The present disclosure relates to an image sensor integrated chip having a deep trench isolation (DTI) structure comprising a reflective element configured to reduce cross-talk between adjacent pixel regions, and an associated method of formation. In some embodiments, the image sensor integrated chip comprises an image sensing element arranged within a substrate. A plurality of protrusions are arranged along a first side of the substrate over the image sensing element and one or more absorption enhancement layers are arranged over and between the plurality of protrusions. A plurality of DTI structures are arranged within trenches disposed on opposing sides of the image sensing element and extend from the first side of the substrate to within the substrate. The plurality of DTI structures respectively comprise a reflective element having one or more reflective regions configured to reflect electromagnetic radiation. By reflecting electromagnetic radiation using the reflective elements, cross-talk between adjacent pixel regions is reduced, thereby improving performance of the image sensor integrated chip.

FIG. 1 illustrates a cross-sectional view of some embodiments of an image sensor integrated chip 100 having a deep trench isolation (DTI) structure comprising a reflective element configured to reduce cross-talk between pixel regions.

The image sensor integrated chip 100 comprises a substrate 102 having a plurality of pixel regions 104a-104b. The plurality of pixel regions 104a-104b respectively comprise an image sensing element 106 configured to convert incident radiation (e.g., photons) into an electric signal (i.e., to generate electron-hole pairs from the incident radiation). In some embodiments, the image sensing element 106 may comprise a photodiode.

A plurality of transistor devices 108 are arranged along a first side 102a of the substrate 102. In some embodiments, transistor devices 108 within respective pixel regions 104a-104b may be separated by shallow trench isolation (STI) structures 128 within the first side 102a of the substrate 102. A dielectric structure 110 is also arranged along the first side 102a of the substrate 102. The dielectric structure 110 surrounds a plurality of conductive interconnect layers 112. In some embodiments, the dielectric structure 110 comprises a plurality of stacked inter-level dielectric (ILD) layers, and the plurality of conductive interconnect layers 112 comprise alternating layers of conductive vias and conductive wires, which are arranged within the stacked ILD layers and electrically coupled to the plurality of transistor devices 108.

A second side 102b of the substrate 102 comprises a non-planar surface defining a plurality of protrusions 114 arranged in a periodic pattern. The plurality of protrusions 114 are laterally separated from one another by recesses 116 within the second side 102b of the substrate 102. In some embodiments, the plurality of protrusions 114 may comprise angled sidewalls. One or more absorption enhancement layers 118 are arranged over the plurality of protrusions 114 and within the recesses 116. One of the one or more absorption enhancement layers 118 contacts the substrate 102 along the non-planar surface to define an absorption enhancement structure 120 with a topography that increases absorption of radiation by the substrate 102 (e.g., by reducing a reflection of radiation from the non-planar surface). Increasing absorption of radiation by the substrate 102 increases a quantum efficiency (QE) of the image sensing element 106, and thereby improves performance of the image sensor integrated chip 100.

The plurality of pixel regions 104a-104b are separated by trenches 122 extending from the second side 102b of the substrate 102 to within the substrate 102. The trenches 122 are filled with a deep trench isolation (DTI) structure 123 configured to provide for electrical isolation between adjacent ones of the plurality of pixel regions 104a-104b. The DTI structure 123 comprises one or more dielectric materials 124 lining interior surfaces of the trenches 122. The DTI structure 123 also comprises a reflective element 126 having one or more reflective regions configured to reflect electromagnetic radiation. In some embodiments, the one or more dielectric materials 124 may comprise a same dielectric material as the one or more absorption enhancement layers 118. In other embodiments, the one or more dielectric materials 124 may comprise different dielectric materials than the one or more absorption enhancement layers 118.

Because the reflective element 126 is configured to reflect electromagnetic radiation, the reflective element 126 reduces cross-talk between adjacent pixel regions 104a-104b. For example, when incident radiation 130 directed towards a first pixel region 104a strikes an interface between the one or more absorption enhancement layers 118 and the substrate 102, a portion 132 of the incident radiation 130 may be refracted towards the second pixel region 104b. The reflective element 126 is configured to reflect the portion 132 of the incident radiation 130 back to the first pixel region, thereby reducing cross-talk and further increasing a quantum efficiency of the image sensor integrated chip 100.

Figure 2:
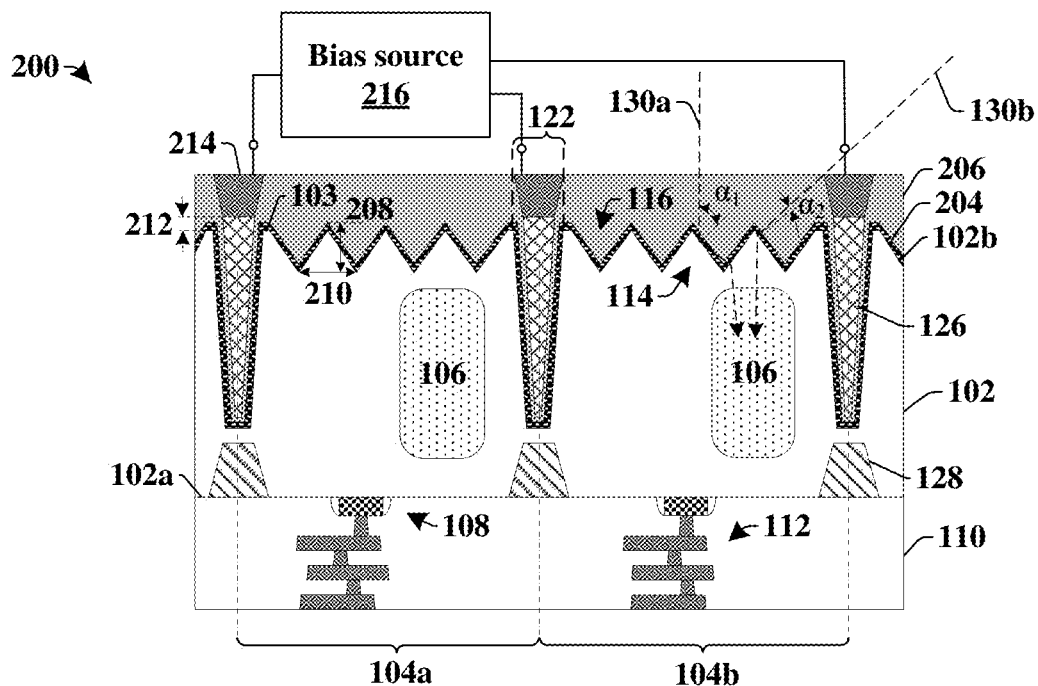
FIG. 2 illustrates a cross-sectional view of an additional embodiment of an image sensor integrated chip having a back-side deep trench isolation (BDTI) structure comprising a reflective element.

FIG. 2 illustrates some additional embodiments of a cross-sectional view of an image sensor integrated chip 200 comprising a back-side deep trench (BDTI) structure having a reflective element.

The image sensor integrated chip 200 comprises a substrate 102 having a plurality of pixel regions 104a-104b respectively comprising an image sensing element 106. A plurality of protrusions 114 are arranged within a second side 102b of the substrate 102. The plurality of protrusions 114 are separated from one another by recesses 116 defined by sidewalls of the protrusions 114. In some embodiments, the plurality of protrusions 114 may comprise cones, conical cylinders, or pyramids (e.g., having an n-sided base, wherein n=3, 4, 5, 6, . . . ). In some embodiments, the plurality of protrusions 114 may have sidewalls that meet at a pinnacle of the protrusions 114.

The plurality of protrusions 114 have a height 208 and a width 210 (measured along largest dimensions of a protrusion). In some embodiments, the height 208 may be in a range of between approximately 400 nm and approximately 600 nm and the width 210 may be in a range of between approximately 400 nm and approximately 500 nm. In other embodiments, the height 208 and the width 210 may be less than 400 nm.

The plurality of pixel regions 104a-104b are bordered by trenches 122 extending into the second side 102b of the substrate 102 to a depth that is greater than that of the plurality of recesses 116. In some embodiments, the trenches 122 may be arranged within horizontally extending surfaces 103 extending between adjacent ones of the pixel regions 104a-104c. In some embodiments (not shown), the horizontally extending surfaces 103 may be located at a height greater than the protrusions 114. For example, in some embodiments, the horizontally extending surfaces 103 may be located a height that is in a range of between approximately 5% and approximately 15% larger than a height of the plurality of protrusions 114. For example, the surface may be located at a height that is in a range of between approximately 500 nm and approximately 700 nm (relative to a bottom of the protrusions 114).

One or more absorption enhancement layers 204-206 are arranged along the second side 102b of the substrate 102 within the recesses 116 and within the trenches 122. The plurality of protrusions 114 and the one or more absorption enhancement layers 204-206 are configured to increase absorption of radiation by the image sensing element 106 by providing for a low reflection of radiation from the substrate 102 (e.g., a reflection of less than or equal to approximately 5% for radiation having a wavelength of between approximately 500 nm and approximately 700 nm). For example, for incident radiation 130a having an angle of incidence $\alpha_1$ greater than a critical angle, angled sidewalls of the protrusions 114 may act to reflect the incident radiation 130a to within the recesses 116, where the incident radiation 130a can be subsequently absorbed into the substrate 102. The angled sidewalls of the protrusions 114 may further act to reduce an angle of incidence $\alpha_2$ for incident radiation 130b having a steep angle with respect to a top surface of the one or more absorption enhancement layers 204-206, thereby preventing the incident radiation 130b from reflecting away from the substrate 102.

In some embodiments, the one or more absorption enhancement layers may comprise an anti-reflective layer 204 and a layer of dielectric material 206 over the anti-reflective layer 204. The anti-reflective layer 204 lines the second side 102b of the substrate 102 and interior surfaces of the trenches 122. The layer of dielectric material 206 is separated from the substrate 102 by the anti-reflective layer 204. In some embodiments, the anti-reflective layer 204 may comprise a high-k dielectric material and the layer of dielectric material 206 may comprise an oxide (e.g., $SiO_2$).

Within the trenches 122, the anti-reflective layer 204 and the layer of dielectric material 206 surround a reflective element 126 configured to reflect electromagnetic radiation. The reflective element 126 may comprise one or more reflective regions. The one or more reflective regions may comprise materials selected to provide for a good QE at different wavelengths of electromagnetic radiation. In some embodiments, the one or more reflective regions may comprise one or more reflective filler materials. The one or more reflective filler materials may comprise metals such as aluminum (Al), rhodium (Rh), ruthenium (Ru), copper (Cu), silver (Ag), gold (Au), tungsten (W), cobalt (Co), iron (Fe), molybdenum (Mo), titanium (Ti), chromium (Cr). For example, a first reflective region may comprise aluminum and an adjacent reflective region may comprise tungsten. In other embodiments, one of the one or more reflective regions may comprise an air gap filled with a gas (e.g., oxygen, nitrogen, etc.).

In some embodiments, the reflective element 126 may extend outward from the trenches 122 so that an uppermost surface of the reflective element 126 overlies an uppermost surface of the substrate 102. For example, the reflective element 126 may extend above the uppermost surface of the substrate 102 by a non-zero distance 212. In other embodiments, the reflective element 126 may not extend outward past an uppermost surface of the substrate 102. For example, in various embodiments, the reflective element 126 may have an uppermost surface that is substantially co-planar with or that is recessed below the uppermost surface of the substrate 102.

In some embodiments, a conductive contact 214 is coupled to the reflective element 126. The conductive contact 214 is configured to be coupled to a bias source 216 configured to provide a bias signal to the reflective element 126. The bias signal is configured to cause the reflective element 126 to form an electromagnetic field that operates upon defects (e.g., impurities, point defects, etc.) within the pixel regions 104a-104b to further improve performance of the image sensor integrated chip 200. For example, in some embodiments, the bias source 216 may apply a negative bias voltage to the reflective element 126 by way of the conductive contact 214. The negative bias voltage causes the reflective element 126 to generate an electromagnetic field that attracts defects towards the edges of the pixel regions 104a-104b, thereby moving the defects away from the image sensing element 106. By moving defects away from the image sensing element 106, the defects are separated from charge carriers (e.g., electrons or holes) formed by the image sensing element 106, thereby reducing unwanted recombination centers that may degrade electrical performance of the image sensing integrated chip 200.

In some embodiments, the conductive contact 214 may extend through the anti-reflective layer 204 and/or the layer of dielectric material 206 to the reflective element 126. In some embodiments, the conductive contact 214 may have a bottommost surface contacting a topmost surface of the reflective element 126. In other embodiments, the conductive contact 214 may have a bottommost surface embedded within a top surface of the reflective element 126 (e.g., as shown in FIG. 3).

FIG. 3 illustrates some additional embodiments of a cross-sectional view of an image sensor integrated chip 300 having a BDTI structure comprising a reflective element.

The image sensor integrated chip 300 comprises a substrate 102 having a plurality of pixel regions 104a-104b respectively comprising an image sensing element 106. A plurality of protrusions 114 are arranged along a second side 102b of the substrate 102. The plurality of pixel regions 104a-104b are bordered by a plurality of trenches 302 extending into the second side 102b of the substrate 102 to a depth that is greater than that of the plurality of recesses 116.

The plurality of trenches 302 are defined by sidewalls 304 and a lower surface 305 of the substrate 102. In some embodiments, the plurality of trenches 302 may have sidewalls 304 comprising a curved segment 304b (e.g., so that the substrate 102 overhangs a part of the trench 302). For example, in some embodiments, in some embodiments, the sidewalls 304 may have a curved segment 304b arranged between substantially linear segments, 304a and 304c. In some embodiments, the sidewalls 304 may define an openings along the second side 102b of the substrate 102, which have a smaller width that an underlying region of the trenches 302. For example, the plurality of trenches 302 may have a maximum width W2 between the curved segments 304b of opposing sidewalls that is greater than a maximum width wi between substantially linear segments, 304a and/or 304b, of the opposing sidewalls.

An anti-reflective layer 204 lines the second side 102b of the substrate 102 and interior surfaces of the plurality of trenches 302. A layer of dielectric material 206 is arranged on the anti-reflective layer 204. Within the trenches 302, the anti-reflective layer 204 and the layer of dielectric material 206 surround a reflective element 306. The reflective element 306 comprises a first reflective region 306a comprising an air gap and a second reflective region 306b comprising one or more reflective filler materials (e.g., one or more metals). In some embodiments, the first reflective region 306a is arranged below the second reflective region 306b. In such embodiments, a conductive contact 214 extends through the layer of dielectric material 206 to contact the second reflective region 306b.

The air gap provides the image sensor integrated chip 300 with a good QE within the near infrared (NIR) region of the electromagnetic spectrum (e.g., in a range of wavelengths between approximately 600 nm and approximately 940 nm). This is because the air gap reflects NIR radiation while having a relatively low absorption of NIR radiation (i.e., having a lower absorption of NIR radiation than a metal).

Figure 4C:
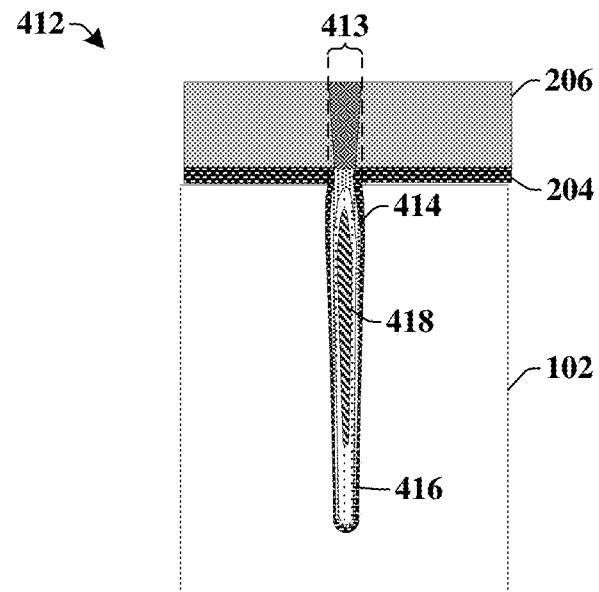

FIGS. 4A-4C illustrate some cross-sectional views of additional embodiments of BDTI structures comprising a reflective element.

FIG. 4A illustrates a cross-sectional view 400 of some additional embodiments of a BDTI structure arranged within a trench 401 in a substrate 102. The BDTI structure comprises a conductive core 402 arranged within the trench 401. The conductive core 402 is separated from the substrate 102 by a dielectric liner 404. An anti-reflective layer 204 is arranged over the conductive core 402 and the dielectric liner 404, and a layer of dielectric material 206 is arranged over the anti-reflective layer 204. In some embodiments, the conductive core 402 may comprise copper and the dielectric liner 404 may comprise titanium nitride (TiN).

FIG. 4B illustrates a cross-sectional view 406 of some additional embodiments of a BDTI structure arranged within a trench 407 in a substrate 102. The BDTI structure comprises an anti-reflective layer 204 lining interior surfaces of the trench 407. A diffusion barrier layer 408 is arranged on the anti-reflective layer 204 and a conductive core 410 is surrounded by the diffusion barrier layer 408. In some embodiments, the conductive core 410 may comprise aluminum and the diffusion barrier layer 408 may comprise titanium nitride (TiN).

FIG. 4C illustrates a cross-sectional view 412 of some additional embodiments of a BDTI structure arranged within a trench 413 in a substrate 102. The BDTI structure comprises an anti-reflective layer 204 lining interior surfaces of the trench 413. A diffusion barrier layer 414 is arranged on the anti-reflective layer 204. The diffusion barrier layer 414 surrounds an air gap 416 and a conductive region 418 over the air gap 416. In some embodiments, the conductive region 418 may comprise tungsten and the diffusion barrier layer 408 may comprise titanium nitride (TiN).

Figure 5:
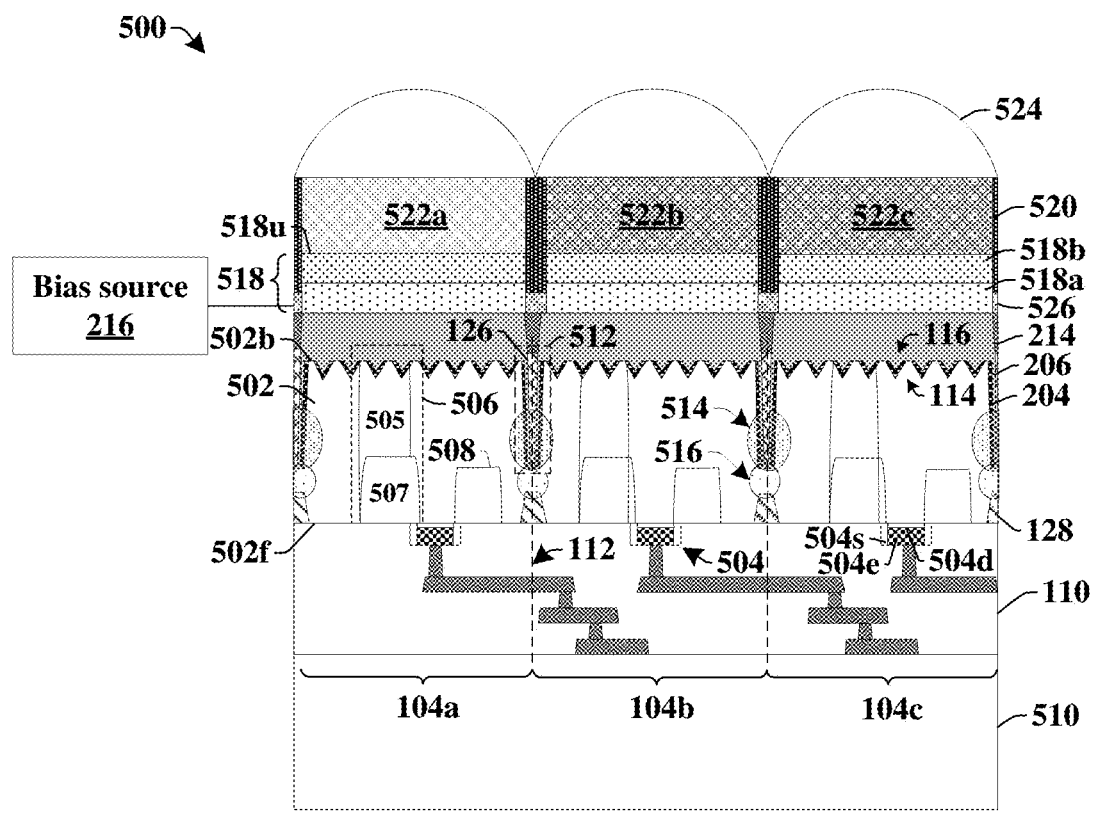
FIG. 5 illustrates a cross-sectional view of some embodiments of a back-side CMOS image sensor (BSI-CIS) having a BDTI structure comprising a reflective element.

FIG. 5 illustrates a cross-sectional view of some embodiments of a back-side illuminated CMOS image sensor (BSI-CIS) integrated chip 500 having a BDTI structure comprising a reflective element. Although FIG. 5 describes BSI-CIS, it will be appreciated that the disclosed BDTI structure may also be used with FSI image sensors.

The BSI-CIS integrated chip 500 comprises a plurality of transistor gate structures 504 arranged along a front-side 502f of a substrate 502. The plurality of transistor gate structures 504 respectively comprise a gate dielectric layer 504d disposed along the front-side 502f of the substrate 502 and a gate electrode 504e arranged on the gate dielectric layer 504d. In some embodiments, sidewall spacers 504s are arranged on opposing sides of the gate electrode 504e. In some embodiments, a transistor gate structure 504 corresponding to a transfer transistor is laterally arranged between a photodiode 506 and a floating diffusion well 508 within the substrate 502. In such embodiments, the photodiode 506 may comprise a first region 505 having a first doping type (e.g., n-type doping) and an adjoining second region 507 within the substrate 502 having a second doping type (e.g., p-type doping) that is different than the first doping type. The transistor gate structure 504 is configured to control the transfer of charge from the photodiode 506 to the floating diffusion well 508. If a charge level is sufficiently high within the floating diffusion well 508, a source-follower transistor (not shown) is activated and charges are selectively output according to operation of a row select transistor (not shown) used for addressing. A reset transistor (not shown) is configured to reset the photodiode 506 between exposure periods.

A dielectric structure 110 is also arranged along the front-side 502f of the substrate 502. The dielectric structure 110 may comprise a plurality of stacked inter-level dielectric (ILD) layers. In various embodiments, the plurality of stacked inter-level dielectric (ILD) layers may comprise one or more of an oxide (e.g., SiO$_2$, SiCO, etc.), a fluorosilicate glass, a phosphate glass (e.g., borophosphate silicate glass), etc. The dielectric structure 110 surrounds a plurality of conductive interconnect layers 112 electrically coupled to the transistor gate structures 504. In some embodiments, the plurality of conductive interconnect layers 112 may comprise one or more of copper, aluminum, tungsten, and carbon nanotubes, for example. In some embodiments, the dielectric structure 110 is coupled to a carrier substrate 510 configured to provide structural support to the BSI-CIS integrated chip 500. In some embodiments, the carrier substrate 510 may comprise silicon.

A plurality of shallow trench isolation (STI) structures 128 are also arranged within the front-side 502f of the substrate 502. The plurality of STI structures 128 comprise one or more dielectric materials (e.g., SiO$_2$) arranged within trenches in the front-side 502f of the substrate 502. A plurality of back-side deep trench isolation (BDTI) structures 512 are arranged within trenches within a back-side 502b of the substrate 502 over the plurality of STI structures 128. The plurality of BDTI structures 512 comprise reflective elements 126 configured to reflect electromagnetic radiation. In some embodiments, the plurality of BDTI structures 512 may respectively have a width that is smaller than a width of one of the plurality of STI structures 128.

In some embodiments, one or more isolation well regions may be arranged between the STI structures 128 and the BDTI structures 512. The one or more isolation well regions may comprise deep-well regions 514 and/or cell-well regions 516 having one or more doping types that provide further isolation between adjacent pixel regions 104a-104c by way of junction isolation. The deep-well regions 514 are arranged in the substrate 502 at a location laterally aligned with the STI structures 128 and/or the BDTI structures 512. The cell-well regions 516 are arranged in the substrate 502 at a location vertically between the deep-well regions 514 and the STI structures 128.

The back-side 502b of the substrate 502 has a non-planar surface comprising a plurality of protrusions 114. An anti-reflection layer 204 and a layer of dielectric material 206 are arranged along the back-side 502b of the substrate 502 and within the plurality of trenches. In some embodiments, a dielectric planarization structure 518 may be arranged over the layer of dielectric material 206. The dielectric planarization structure 518 has a substantially planar upper surface 518u. In various embodiments, the dielectric planarization structure 518 may comprise one or more stacked dielectric layers 518a-518b. For example, in some embodiments, the dielectric planarization structure 518 may comprise a first dielectric layer 518a comprising a first material and a second dielectric layer 518b stacked onto the first dielectric layer 518a and comprising a second material. In some embodiments, the first material and/or the second material may comprise an oxide (e.g., SiO$_2$) or a nitride, for example.

A grid structure 520 is disposed over the dielectric planarization structure 518. The grid structure 520 comprises sidewalls that define openings overlying the pixel regions 104a-104c. In various embodiments, the grid structure 520 may comprise a metal (e.g., aluminum, cobalt, copper, silver, gold, tungsten, etc.) and/or a dielectric material (e.g., SiO$_2$, SiN, etc.). A plurality of color filters, 522a-522c, are arranged within the openings in the grid structure 520. The plurality of color filters, 522a-522c, are respectively configured to transmit specific wavelengths of incident radiation. For example, a first color filter 522a may transmit radiation having wavelengths within a first range (e.g., corresponding to green light), while a second color filter 522b may transmit radiation having wavelengths within a second range (e.g., corresponding to red light) different than the first range, etc. A plurality of micro-lenses 524 are arranged over the plurality of color filters 522a-522c. Respective ones of the plurality of micro-lenses 524 are laterally aligned with the color filters, 522a-522c, and overlie the pixel regions 104a-104c. The plurality of micro-lenses 524 are configured to focus the incident radiation (e.g., light) towards the pixel regions 104a-104c.

In some embodiments, a conductive routing layer 526 may be arranged over the layer of dielectric material 206. The conductive routing layer 526 electrically couples a conductive contact 214 contacting the reflective element 126 to a bias source 216 (e.g., via a port located outside of the pixel regions 104a-104c). In some embodiments, the conductive routing layer 526 may arranged below the grid structure 520 so as to not block incident radiation from reaching the pixel regions 104a-104c.

FIGS. 6-17 illustrate cross-sectional views 600-1700 of some embodiments of a method of forming an image sensor integrated chip comprising a BDTI structure having a reflective element. Although the cross-sectional views 600-1700 shown in FIGS. 6-17 are described with reference to a method of forming a back-side deep trench isolation (BDTI) structure for an image sensor integrated chip, it will be appreciated that the structures shown in FIGS. 6-17 are not limited to the method of formation but rather may stand alone separate of the method. Furthermore, although the method describes the formation of a BSI image sensor, it will be appreciated that the disclosed DTI structure may also be used with FSI image sensors.

Figure 6:
FIGS. 6-17 illustrate cross-sectional views of some embodiments of a method of forming an image sensor integrated chip having a BDTI structure comprising a reflective element.

As shown in cross-sectional view 600 of FIG. 6, a back-side 602b of a substrate 602 is bonded to a support substrate 604. The substrate 602 may be any type of semiconductor body (e.g., silicon, SiGe, SOI, etc.), as well as any other type of semiconductor and/or epitaxial layers, associated therewith. For example, in some embodiments, the substrate 602 may comprise a base substrate and an epitaxial layer. In some embodiments, the support substrate 602 may comprise a silicon substrate. In some embodiments, the substrate 604 may be thinned after bonding to form a substrate 502. Thinning the substrate 604 allows for radiation to pass more easily to image sensing elements subsequently formed within the substrate 502. In various embodiments, the substrate 604 may be thinned by etching and/or mechanical grinding a front-side 602f of the substrate 602.

Figure 7:
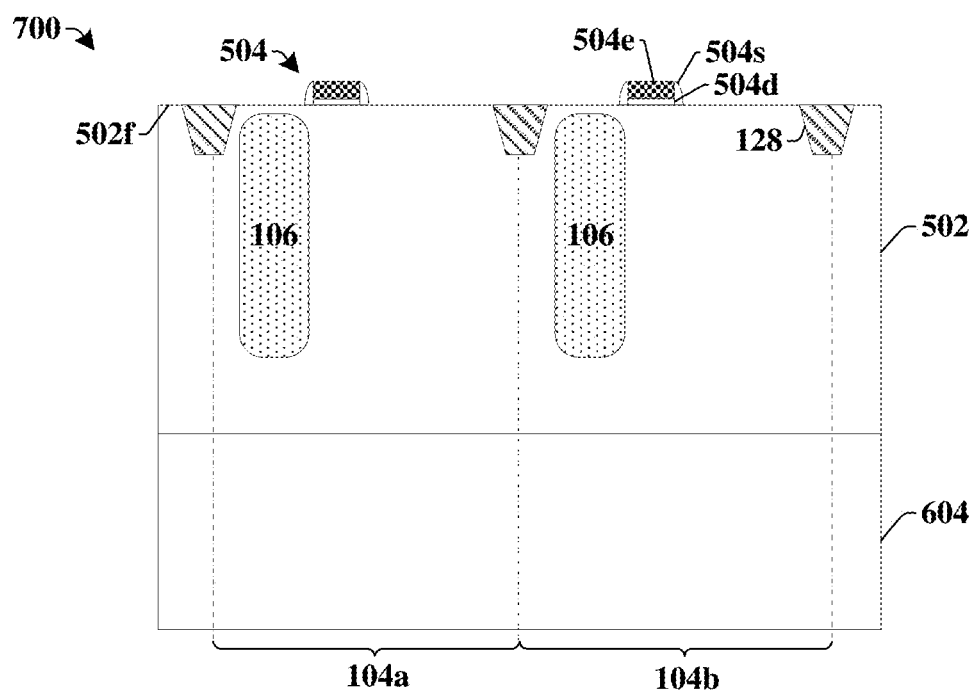

As shown in cross-sectional view 700 of FIG. 7, image sensing elements 106 are formed within pixel regions 104a-104b of the substrate 502. In some embodiments, the image sensing elements 106 may comprise photodiodes formed by implanting one or more dopant species into a front-side 502f of the substrate 502. For example, the photodiodes may be formed by selectively performing a first implantation process (e.g., according to a masking layer) to form a first region having a first doping type (e.g., n-type), and subsequently performing a second implantation process to form a second region abutting the first region and having a second doping type (e.g., p-type) different than the first doping type. In some embodiments a floating diffusion well (not shown) may also be formed using one of the first or second implantation processes.

One or more transistor gate structures 504 are formed along the front-side 502f of the substrate 502 within the pixel regions 104a-104b. In various embodiments, the one or more transistor gate structures 504 may correspond to a transfer transistor, a source-follower transistor, a row select transistor, and/or a reset transistor. In some embodiments, the one or more transistor gate structures 504 may be formed by depositing a gate dielectric film and a gate electrode film on the front-side 502f of the substrate 502. The gate dielectric film and the gate electrode film are subsequently patterned to form a gate dielectric layer 504d and a gate electrode 504e. Sidewall spacers 504s may be formed on the outer sidewalls of the gate electrode 504e. In some embodiments, the sidewall spacers 504s may be formed by depositing a spacer layer (e.g., a nitride, an oxide, etc.) onto the front-side 502f of the substrate 502 and selectively etching the spacer layer to form the sidewall spacers 504s.

In some embodiments, one or more shallow trench isolation (STI) structures 128 may be formed within the front-side 502f of the substrate 502 on opposing sides of the pixel regions 104a-104b. The STI structures 128 may be formed by selectively etching the front-side 502f of the substrate 502 to form shallow trenches and subsequently forming one or more dielectric materials within the shallow trenches. In some embodiments, the STI structures 128 may be formed prior to formation of the one or more transistor gate structures 504 and/or the image sensing elements 106.

Figure 8:
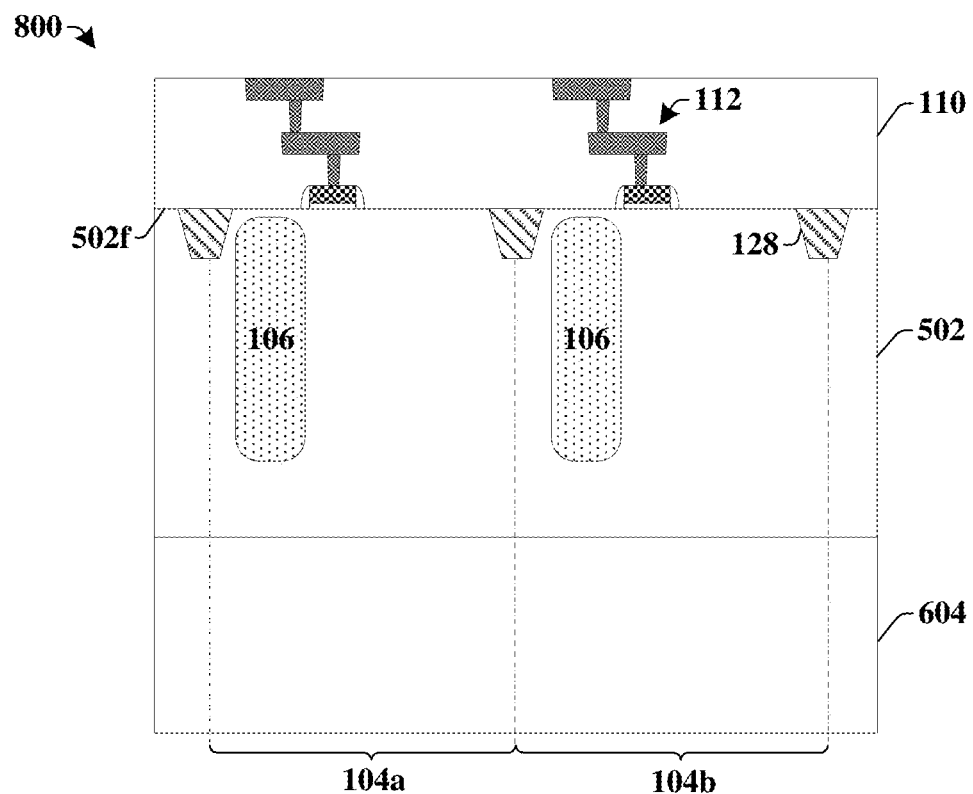

As shown in cross-sectional view 800 of FIG. 8, a plurality of conductive interconnect layers 112 are formed within a dielectric structure 110 formed along the front-side 502f of the substrate 502. The dielectric structure 110 comprises a plurality of stacked ILD layers, while the plurality of conductive interconnect layers 112 comprise alternating layers of conductive wires and vias. In some embodiments, one or more of the plurality of conductive interconnect layers 112 may be formed using a damascene process (e.g., a single damascene process or a dual damascene process). The damascene process is performed by forming an ILD layer over the front-side 502f of the substrate 502, etching the ILD layer to form a via hole and/or a metal trench, and filling the via hole and/or metal trench with a conductive material. In some embodiments, the ILD layer may be deposited by a physical vapor deposition technique (e.g., PVD, CVD, PE-CVD, ALD, etc.) and the conductive material may be formed using a deposition process and/or a plating process (e.g., electroplating, electroless plating, etc.). In various embodiments, the plurality of conductive interconnect layers 112 may comprise tungsten, copper, or aluminum copper, for example. In some embodiments, the support structure 604 may be removed after forming the dielectric structure 110 along the front-side 502f of the substrate 502.

Figure 9:
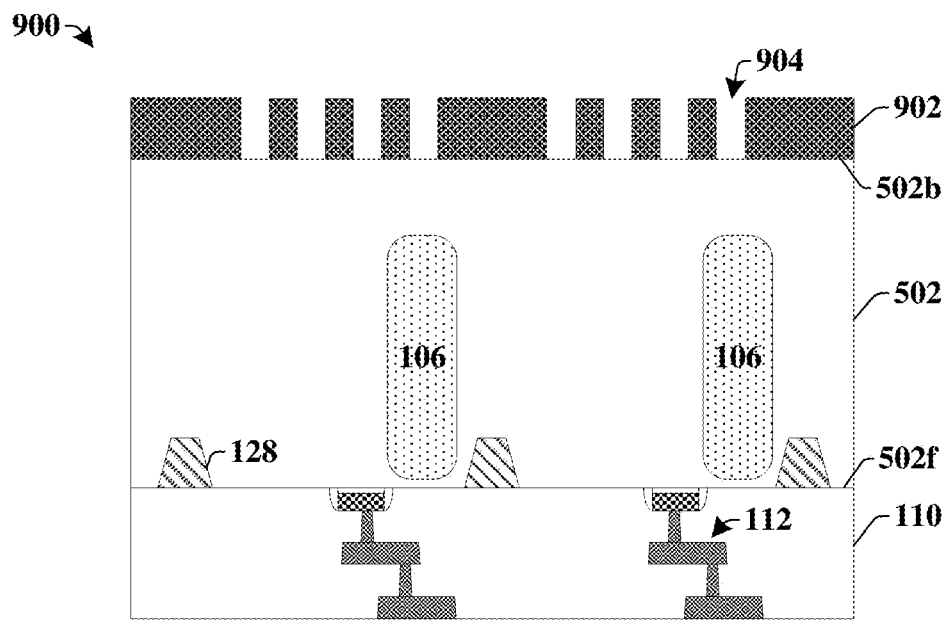

As shown in cross-sectional view 900 of FIG. 9, a first patterned masking layer 902 is formed along the back-side 502b of the substrate 502. The first patterned masking layer 902 comprises sidewalls defining openings 904 along the back-side 502b of the substrate 502. In some embodiments, the first patterned masking layer 902 may be formed by depositing a layer of photosensitive material (e.g., a positive or negative photoresist) along the back-side 502b of the substrate 502. The layer of photosensitive material is selectively exposed to electromagnetic radiation according to a photomask. The electromagnetic radiation modifies a solubility of exposed regions within the photosensitive material to define soluble regions. The photosensitive material is subsequently developed to define the openings 904 within the photosensitive material by removing the soluble regions.

Figure 10:
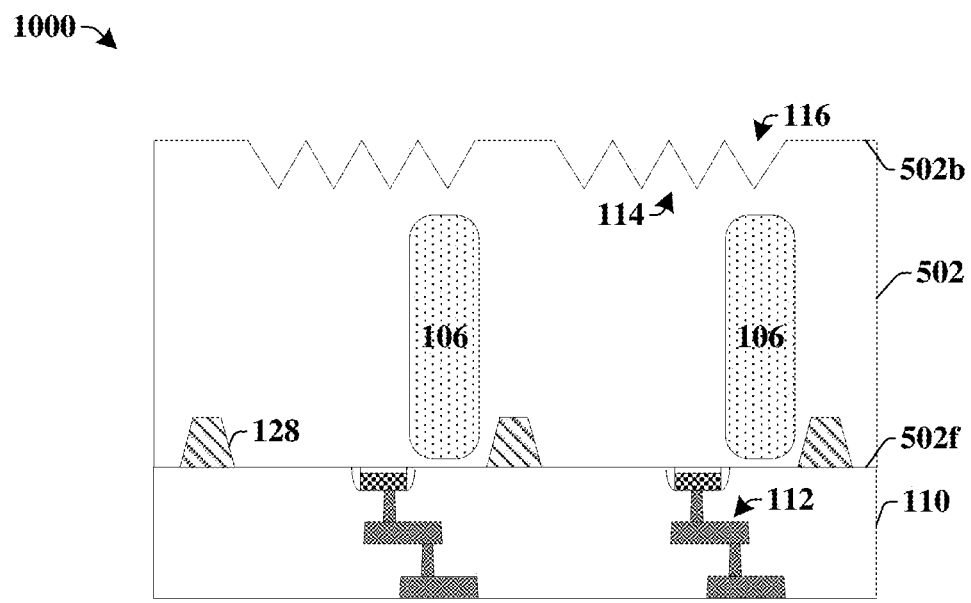

As shown in cross-sectional view 1000 of FIG. 10, a first etching process is performed on the back-side 502b of the substrate 502 according to the first patterned masking layer (902 of FIG. 9). The first etching process is performed by exposing the substrate 502 to one or more etchants with the first patterned masking layer in place. The one or more etchants remove parts of the substrate 502 to define a plurality of recesses 116 arranged between a plurality of protrusions 114 extending outward from the substrate 502. In some embodiments, the first etching process may comprise a dry etching process. For example, the first etching process may comprise a coupled plasma etching process, such as an inductively coupled plasma (ICP) etching process or a capacitively coupled plasma (CCP) etching process. In other embodiments, the first etching process may comprise a wet etching process.

Figure 11:
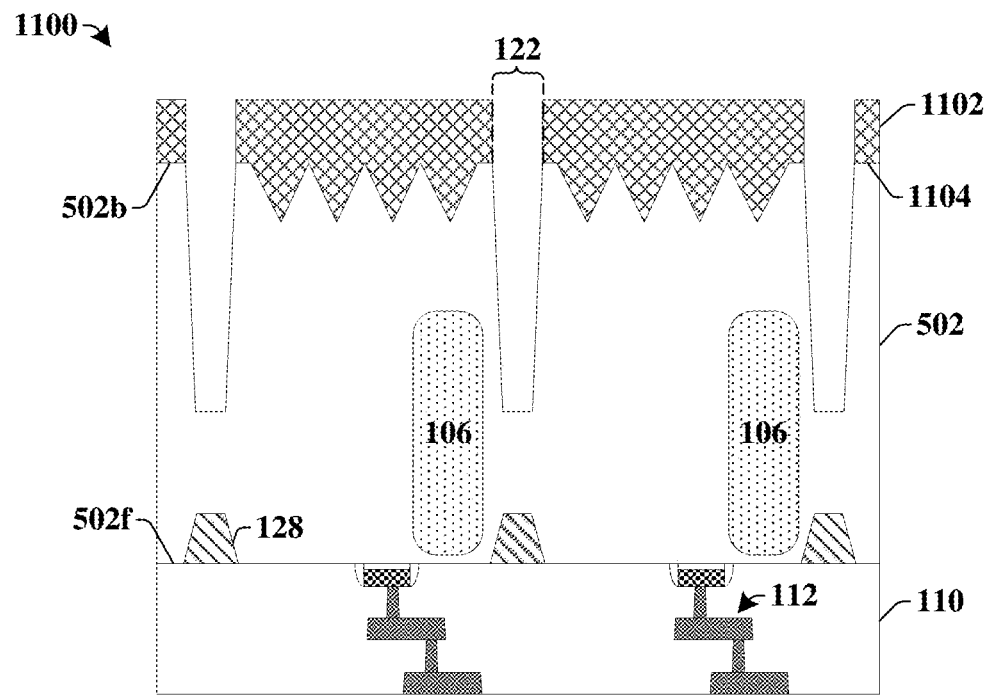

As shown in cross-sectional view 1100 of FIG. 11, a second etching process is performed on the back-side 502b of the substrate 502 according to a second patterned masking layer 1102. The second etching process is performed by exposing unmasked regions of the substrate 502 to one or more etchants, which remove parts of the substrate 502 in the unmasked regions to define trenches 122 within the substrate 502. In some embodiments, the trenches 122 may be arranged within horizontally extending surfaces 1104 of the substrate 602. In some embodiments, the trenches 122 comprise tapered sidewalls that cause a width of the trenches 122 to respectively decrease as a distance from the back-side 502b of the substrate 502 increases.

Figure 12:
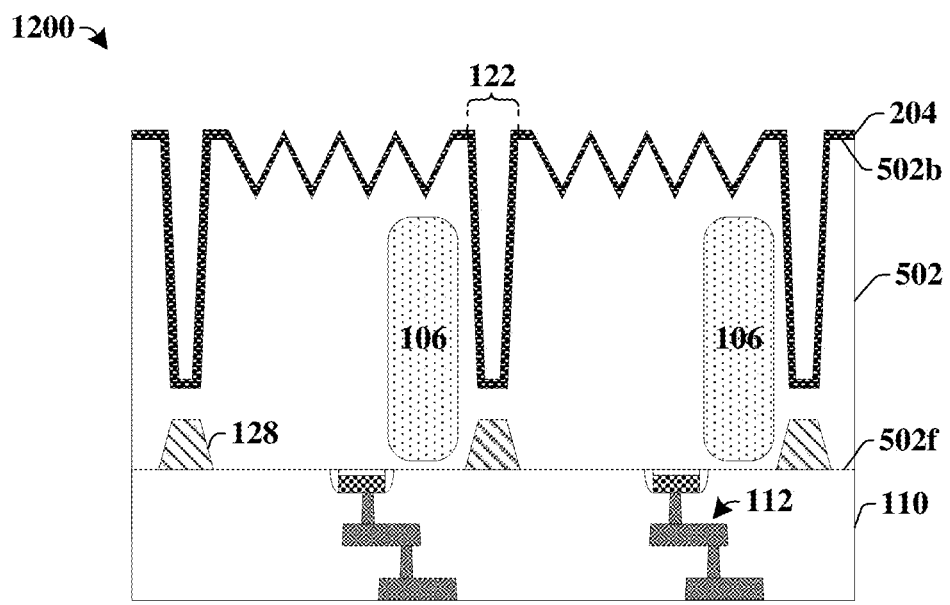

As shown in cross-sectional view 1200 of FIG. 12, an anti-reflective layer 204 is formed along the back-side 502b of the substrate 502. The anti-reflective layer 204 lines the back-side 502b of the substrate 502. In some embodiments, the anti-reflective layer 204 may further line interior surfaces of the trenches 122. In some embodiments, the anti-reflective layer 204 may comprise a high-k dielectric layer including hafnium oxide ($HfO_2$), titanium oxide ($TiO_2$), hafnium zirconium oxide (HfZrO), tantalum oxide ($Ta_2O_3$), hafnium silicon oxide ($HfSiO_4$), zirconium oxide ($ZrO_2$), zirconium silicon oxide ($ZrSiO_2$), etc. In some embodiments, the anti-reflective layer 204 may be deposited by a physical vapor deposition technique (e.g., PVD, CVD, PE-CVD, ALD, etc.).

Figure 13:
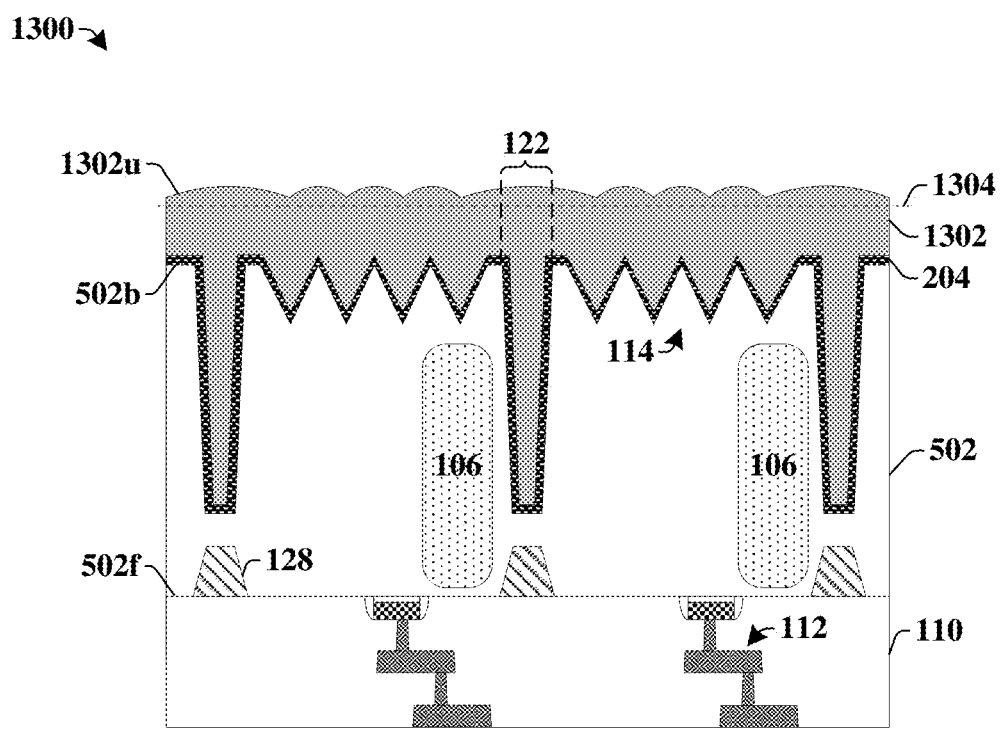

As shown in cross-sectional view 1300 of FIG. 13, a layer of dielectric material 1302 is formed over the anti-reflective layer 204. In various embodiments, the layer of dielectric material 1302 may comprise an oxide (e.g., silicon oxide), TEOS, etc. In some embodiments, the layer of dielectric material 1302 may extend between adjacent ones of the plurality of protrusions 114 and fill the trenches 122. The layer of dielectric material 1302 may be deposited to have an upper surface 1302u comprising a plurality of curved surfaces arranged over the protrusions 114 and intersecting one another. In some embodiments, the plurality of curved surfaces may be removed by a subsequent planarization process (e.g., a chemical mechanical planarization process) to form a substantially planar surface along line 1304.

Figure 14:
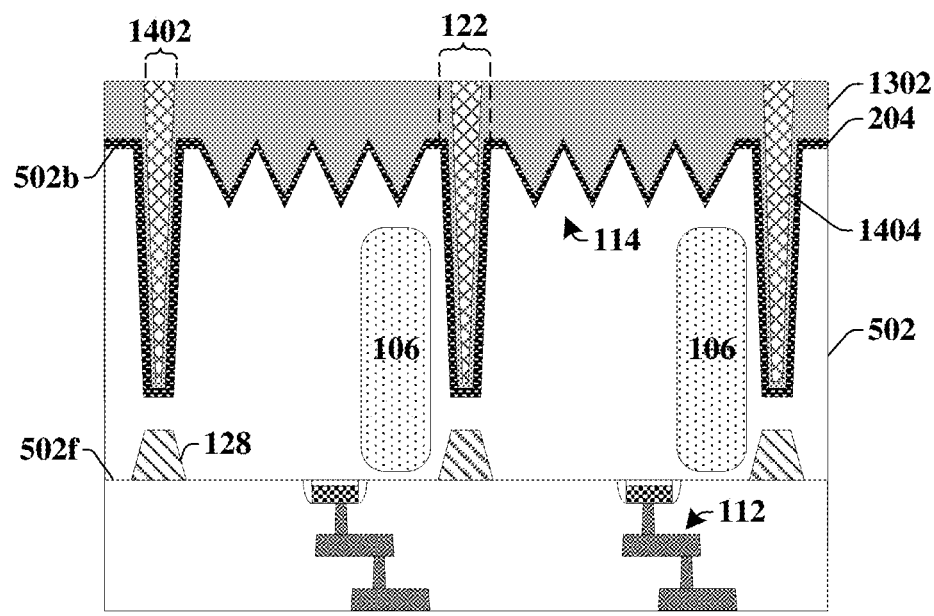

As shown in cross-sectional view 1400 of FIG. 14, a third etching process is performed to form remove the layer of dielectric material 1302 from within the trenches 122. The removal of the layer of dielectric material 1302 from within the trenches 122 results in cavities 1402 within the trenches 122. The cavities 1402 are subsequently filled with one or more reflective filler materials 1404. In various embodiments, the one or more reflective filler materials 1404 may comprise aluminum (Al), rhodium (Rh), ruthenium (Ru), copper (Cu), silver (Ag), gold (Au), tungsten (W), cobalt (Co), iron (Fe), molybdenum (Mo), titanium (Ti), chromium (Cr).

In some embodiments (not shown), the one or more reflective filler materials 1404 may not fill an entirety of the cavities 1402, resulting in cavities respectively comprising one or more reflective regions including the one or more reflective filler materials 1404 and a reflective region including an air gap. For example, in some embodiments, the trenches 122 may have curved sidewalls that define an opening along back-side 502b of the substrate 502, which has a smaller width that an underlying region of the cavities 1402. When the one or more reflective filler materials 1404 are deposited into the cavities 1402, the one or more reflective filler materials 1404 may close the opening prior to filling an entirety of the cavities 1402, resulting in an air gap within the trenches 122.

Figure 15:
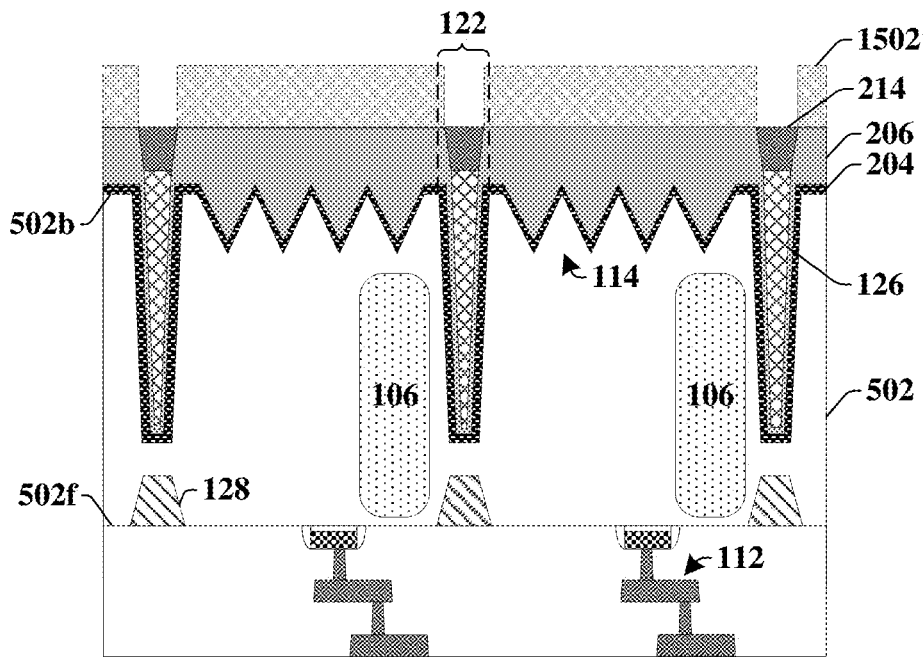

As shown in cross-sectional view 1500 of FIG. 15, a conductive contact 214 is formed over the one or more reflective filler materials. The conductive contact 214 may comprise a metal, such as copper, aluminum, tungsten, etc. In some embodiments, the conductive contact 214 may be formed by performing a fourth etching process to etch the one or more reflective filler materials (1404 of FIG. 14) and/or the layer of dielectric material (1302 of FIG. 14) according to a third patterned masking layer 1502 to form a recess over a reflective element 126. Conductive material is subsequently formed within the recess to form the conductive contact 214. In some such embodiments, the sidewalls of the conductive contact 214 may have a different sidewall angle (e.g., a smaller slope) than sidewalls of the reflective element 126.

Figure 16:
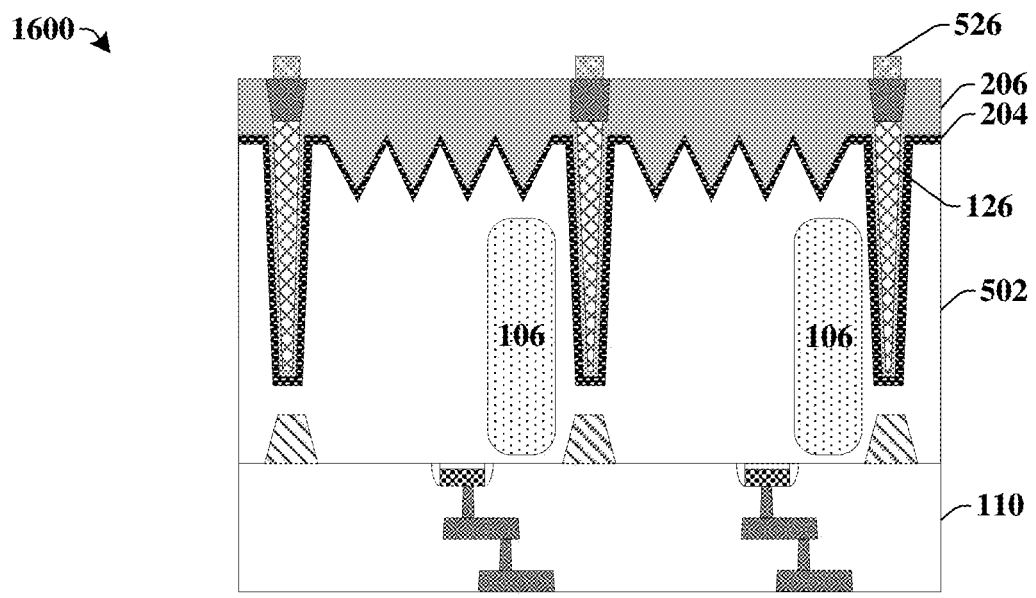

As shown in cross-sectional view 1600 of FIG. 16, a conductive routing layer 526 is formed over the layer of dielectric material 206. The conductive routing layer is coupled to the conductive contact 214. In some embodiments, the conductive routing layer 526 may be formed by depositing a metal over the conductive contact 214 and/or layer of dielectric material 206 and subsequently patterning the metal.

Figure 17:
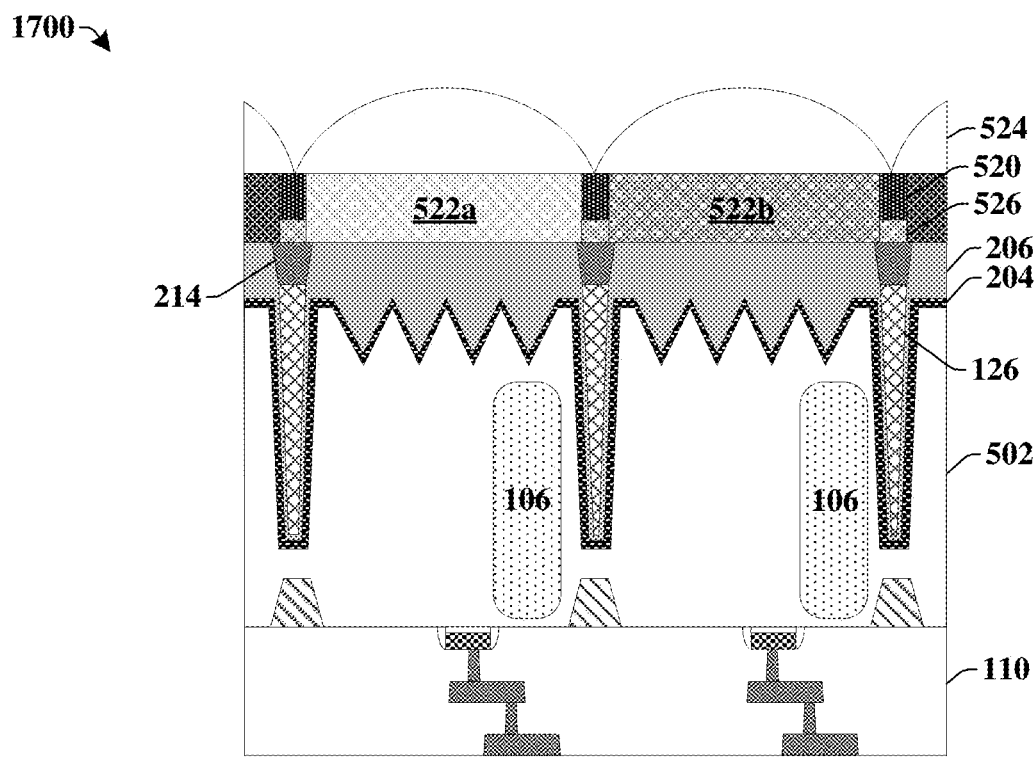

As shown in cross-sectional view 1700 of FIG. 17, a plurality of color filters 522a-522b are formed over the layer of dielectric material 206. In some embodiments, the plurality of color filters 522a-522b may be formed within openings in a grid structure 520 overlying the layer of dielectric material 206 and/or the conductive contact 214. In some embodiments, the plurality of color filters 522a-522b may be formed by forming a color filter layer and patterning the color filter layer. The color filter layer is formed of a material that allows for the transmission of radiation (e.g., light) having a specific range of wavelength, while blocking light of wavelengths outside of the specified range.

A plurality of micro-lenses 524 are formed over the plurality of color filters 522a-522b. In some embodiments, the plurality of micro-lenses 524 may be formed by depositing a micro-lens material above the plurality of color filters (e.g., by a spin-on method or a deposition process). A micro-lens template (not shown) having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The plurality of micro-lenses 524 are then formed by selectively etching the micro-lens material according to the micro-lens template.

Figure 18:
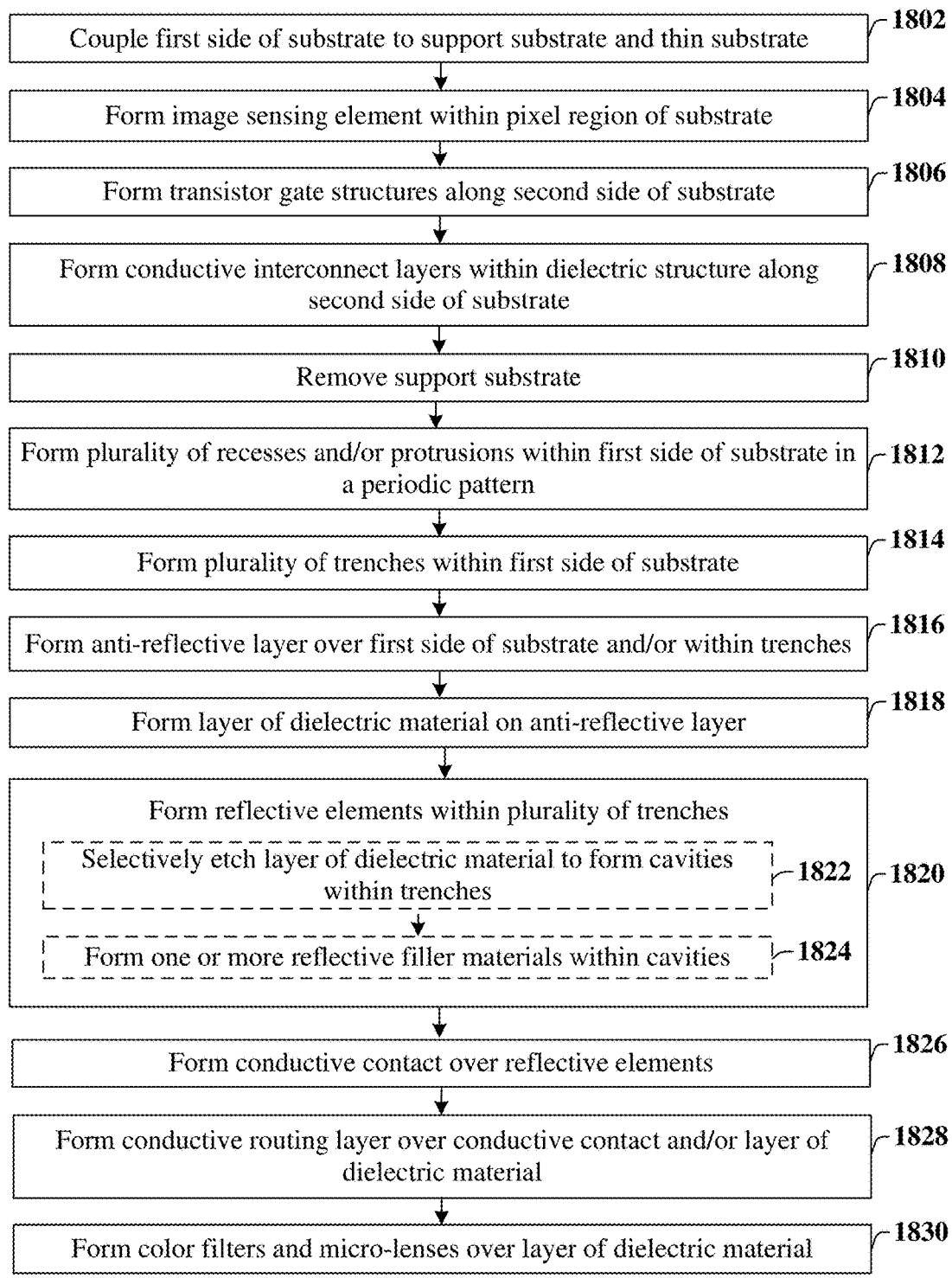
FIG. 18 illustrates a flow diagram of some embodiments of a method of forming an image sensor integrated chip having a BDTI structure comprising a reflective element.

FIG. 18 illustrates a flow diagram of some embodiments of a method 1800 of forming an image sensor integrated chip having a BDTI structure comprising a reflective element.

While method 1800 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1802, a first side of a substrate is coupled to a support substrate and the substrate is thinned to reduce a thickness of the substrate. FIG. 6 illustrates a cross-sectional view 600 of some embodiments corresponding to act 1802.

At 1804, an image sensing element is formed within a pixel region of a substrate. FIG. 7 illustrates a cross-sectional view 700 of some embodiments corresponding to act 1804.

At 1806, one or more transistor gate structures are formed along a second side of the substrate over the pixel region. FIG. 7 illustrates a cross-sectional view 700 of some embodiments corresponding to act 1806.

At 1808, a plurality of conductive interconnect layers are formed within a dielectric structure along the second side of the substrate. FIG. 8 illustrates a cross-sectional view 800 of some embodiments corresponding to act 1808.

At 1810, the support substrate is removed. FIG. 9 illustrates a cross-sectional view 900 of some embodiments corresponding to act 1810.

At 1812, a plurality of recesses and/or protrusions are formed within a first side of the substrate. In some embodiments, the plurality of recesses and/or protrusions may be formed by selectively etching the first side of the substrate according to a patterned masking layer. FIGS. 9-10 illustrate cross-sectional views 900-1000 of some embodiments corresponding to act 1812.

At 1814, a plurality of trenches are formed within the first side of the substrate. In some embodiments, the plurality of trenches are formed by selectively etching the first side of the substrate according to a second masking layer. FIG. 11 illustrates a cross-sectional view 1100 of some embodiments corresponding to act 1814.

At 1816, an anti-reflective layer is formed over the first side of the substrate. In some embodiments, the anti-reflective layer may also be formed within the plurality of trenches. FIG. 12 illustrates a cross-sectional view 1200 of some embodiments corresponding to act 1816.

At 1818, a layer of dielectric material is formed on the anti-reflective layer. FIG. 13 illustrates a cross-sectional view 1300 of some embodiments corresponding to act 1818.

At 1820, reflective elements are formed within the plurality of trenches. FIG. 14 illustrates a cross-sectional view 1400 of some embodiments corresponding to act 1820. In some embodiments, the reflective elements may be formed according to acts 1822-1824. At 1822, layer of dielectric material is removed from within the plurality of trenches to form cavities within the plurality of trenches. At 1824, one or more reflective filler materials are formed within the cavities.

At 1826, a conductive contacts are formed within the layer of dielectric material over the reflective elements. FIG. 15 illustrates a cross-sectional view 1500 of some embodiments corresponding to act 1826.

At 1828, a conductive routing layer is formed over the conductive contact and/or the layer of dielectric material. FIG. 16 illustrates a cross-sectional view 1600 of some embodiments corresponding to act 1828.

At 1830, color filters and micro-lenses are formed over the layer of dielectric material. FIG. 17 illustrates a cross-sectional view 1700 of some embodiments corresponding to act 1830.

Accordingly, the present disclosure relates to an image sensor integrated chip comprising a deep trench isolation (DTI) structure having a reflective element configured to reduce cross-talk between pixel regions, and an associated method of formation.

In some embodiments, the present disclosure relates to an image sensor integrated chip. The integrated chip includes an image sensing element arranged within a substrate, and a plurality of protrusions arranged along a first side of the substrate over the image sensing element. One or more absorption enhancement layers are arranged over and between the plurality of protrusions. A plurality of deep trench isolation (DTI) structures are arranged within trenches disposed on opposing sides of the image sensing element. The plurality of DTI structures extend from the first side of the substrate to within the substrate. The plurality of DTI structures comprise a reflective element configured to reflect electromagnetic radiation.

In other embodiments, the present disclosure relates to an image sensor integrated chip. The integrated chip includes an image sensing element arranged within a substrate. The substrate has interior surfaces defining a plurality of trenches extending from a back-side of the substrate to within the substrate on opposing sides of the image sensing element. A plurality of protrusions are arranged along the back-side of the substrate over the image sensing element and one or more absorption enhancement layers are on and in contact with the plurality of protrusions. A plurality of reflective elements are arranged within the plurality of trenches. The plurality of reflective elements are separated from the substrate by one or more dielectric materials.

In yet other embodiments, the present disclosure relates to a method of forming an image sensor. The method includes performing a first etching process on a first side of a substrate to define a plurality of protrusions along the first side of the substrate, and performing a second etching process on the first side of the substrate to define a plurality of trenches extending to within the substrate. The first etching process and the second etching process are separate etching processes. The method further includes forming one or more absorption enhancement layers over and between the plurality of protrusions and performing a third etching process on the one or more absorption enhancement layers to form cavities extending to within the plurality of trenches. The method further includes forming reflective elements within the plurality of trenches.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
 a photodetector arranged within a semiconductor substrate;
 one or more isolation structures arranged within one or more trenches defined by sidewalls of the semiconductor substrate arranged on opposing sides of the photodetector; and
 wherein the one or more trenches extend from a first side of the semiconductor substrate to within the semiconductor substrate, wherein the one or more isolation structures respectively comprise a reflective medium including a metal configured to reflect electromagnetic radiation, and wherein the metal has a topmost surface and a bottommost surface that both extend between outermost sidewalls of the metal, the outermost sidewalls of the metal being directly and laterally between the sidewalls of the semiconductor substrate.

2. The integrated chip of claim 1, wherein the metal has a largest height measured along a vertical line bisecting the metal.

3. The integrated chip of claim 1, wherein the one or more isolation structures respectively comprise a dielectric material separating reflective medium from the sidewalls of the semiconductor substrate, the dielectric material having thicknesses that vary over a vertical distance, the thicknesses being measured between a first sidewall of the sidewalls of the semiconductor substrate and a sidewall of the reflective medium facing the first sidewall.

4. The integrated chip of claim 1, further comprising:
one or more shallow trench isolation (STI) structures arranged along a second side of the semiconductor substrate opposing the first side of the semiconductor substrate, the one or more STI structures being arranged between additional sidewalls of the semiconductor substrate and directly below the one or more isolation structures, the semiconductor substrate vertically separating the one or more STI structures from the one or more isolation structures.

5. The integrated chip of claim 1, further comprising:
one or more transistor devices disposed along a second side of the semiconductor substrate opposing the first side of the semiconductor substrate, wherein the semiconductor substrate comprises surfaces defining a plurality of protrusions arranged over the photodetector and along the first side of the semiconductor substrate.

6. The integrated chip of claim 1, wherein the reflective medium extends between a bottom and a top of the reflective medium along a center of the reflective medium that is within a first trench of the one or more trenches, as viewed along a cross-sectional view.

7. The integrated chip of claim 1, wherein a vertical line that bisects the metal also extends through the topmost surface and the bottommost surface of the metal.

8. The integrated chip of claim 1, wherein the metal continuously extends between outermost sides of the reflective medium along a horizontally extending line bisecting the reflective medium.

9. The integrated chip of claim 1, wherein the one or more isolation structures comprise a core of the metal surrounded by a dielectric material.

10. An integrated chip, comprising:
a photodetector arranged within a substrate, wherein the substrate has sidewalls defining one or more trenches laterally surrounding the photodetector and vertically extending from a first side of the substrate to within the substrate;
one or more dielectric materials disposed along the sidewalls of the substrate defining the one or more trenches;
one or more reflective structures arranged within the one or more trenches, wherein the one or more reflective structures have sides that are laterally separated from the sidewalls of the substrate by the one or more dielectric materials and wherein the one or more reflective structures completely fill an area between sidewalls of the one or more dielectric materials; and
one or more isolation structures arranged along a second side of the substrate opposing the first side of the substrate, the one or more isolation structures being laterally between additional sidewalls of the substrate and vertically separated from the one or more reflective structures by the substrate.

11. The integrated chip of claim 10, wherein the one or more reflective structures comprise a metal and a cavity, the cavity being arranged vertically and directly between a bottom of the metal that faces the substrate and a bottom of the one or more trenches and the cavity being arranged laterally and directly between the sidewalls of the substrate defining the one or more trenches.

12. The integrated chip of claim 10, further comprising:
a bias source configured to provide a bias signal to the one or more reflective structures.

13. The integrated chip of claim 10,
wherein the one or more reflective structures comprise a bottom that faces the second side of the substrate; and
wherein the bottom is vertically separated from the second side by a non-zero distance extending through the substrate.

14. The integrated chip of claim 10, wherein the one or more reflective structures have a maximum width that is vertically between a topmost surface and a bottommost surface of the one or more reflective structures.

15. The integrated chip of claim 10, further comprising:
one or more transistor devices disposed along the second side of the substrate.

16. A method of forming an integrated chip, comprising:
performing a first etching process on a first side of a substrate to define one or more trenches extending to within the substrate;
forming a fill material within the one or more trenches;
performing a second etching process on the fill material to form a cavity within the fill material, wherein the cavity is formed by sidewalls of the fill material and a horizontally extending surface of the fill material that is laterally between the sidewalls; and
forming one or more reflective materials within the cavity after performing the second etching process.

17. The method of claim 16, further comprising:
performing a third etching process onto the first side of the substrate prior to performing the first etching process, wherein the third etching process forms one or more protrusions along the first side of the substrate.

18. The method of claim 17, wherein a part of the cavity, which is directly between sidewalls of the substrate forming the one or more trenches, is completely filled with the one or more reflective materials.

19. The method of claim 16, further comprising:
forming a conductive material onto an upper surface of the one or more reflective materials that faces away from the substrate.

20. The method of claim 16, wherein the cavity is laterally and directly between sidewalls of the substrate forming the one or more trenches.

* * * * *